United States Patent
Jang et al.

[11] Patent Number: 6,153,481
[45] Date of Patent: Nov. 28, 2000

[54] METHOD FOR FORMING AN ISOLATION INSULATING FILM FOR INTERNAL ELEMENTS OF A SEMICONDUCTOR DEVICE

[75] Inventors: Se Aug Jang; Byung Jin Cho; Chan Lim, all of Ichon, Rep. of Korea

[73] Assignee: Hyundai Electronics Industries Co., Ltd., Ichon, Rep. of Korea

[21] Appl. No.: 09/071,163

[22] Filed: May 4, 1998

[30] Foreign Application Priority Data

May 7, 1997 [KR] Rep. of Korea ...................... 97-17504

[51] Int. Cl.[7] .......................... H01L 21/336; H01L 21/76
[52] U.S. Cl. ............................................. 438/297; 438/439
[58] Field of Search .................................... 438/439, 297

[56] References Cited

U.S. PATENT DOCUMENTS

| | | |
|---|---|---|
| 5,298,451 | 3/1994 | Rao . |
| 5,506,440 | 4/1996 | Wei et al. . |
| 5,683,933 | 11/1997 | Seino . |
| 5,814,551 | 9/1998 | Park et al. . |
| 5,874,325 | 2/1999 | Koike . |
| 5,891,789 | 4/1999 | Lee . |
| 5,985,738 | 11/1999 | Jang et al. . |
| 6,027,984 | 2/2000 | Thakur et al. . |

FOREIGN PATENT DOCUMENTS

| | | |
|---|---|---|
| 2-270324 | 5/1990 | Japan . |
| 2-270324 | 11/1990 | Japan . |
| 9-008020 | 1/1997 | Japan . |

OTHER PUBLICATIONS

Wolf, S and Tauber, R.N., Silicon Processing for the VLSI Era, vol. 1, pp. 133–136, 142–3, Lattice Press, 1986.

Hyeokjae Lee et al., A New Leakage Component Caused by the Interaction of Residual Stress and the Relative Position of Poly–Si Gate at Isolation Edge, IEDM, 1995, pp. 683–686.

Stanley Wolf, Ph.D., Silicon Processing For the VLSI ERA, Vol. 2: Process Integration, Lattice Press, 1990, p. 48.

*Primary Examiner*—John F. Niebling
*Assistant Examiner*—Josetta Jones
*Attorney, Agent, or Firm*—Jacobson, Price, Holman & Stern, PLLC

[57] ABSTRACT

There is provided a method for forming element isolation insulating film of a semiconductor device by employing PBL method for reducing the bird's beak and increasing the length of the effective active region. The method comprising the steps of forming a pad-oxide film, a stack-silicon film, and a nitride film on a semiconductor substrate in sequence; forming an element isolation region by selectively patterning the nitride film with an etching process by using an element isolation mask; and forming an element isolation film by field-oxidizing the element isolation region over the semiconductor substrate.

13 Claims, 6 Drawing Sheets

METHOD FOR FORMING AN ISOLATION INSULATING FILM FOR INTERNAL ELEMENTS OF A SEMICONDUCTOR DEVICE

FIELD OF THE INVENTION

The present invention relates to a method for forming an isolating film for internal elements of a semiconductor device, and more particularly, to a technique of using stack-polycrystalline silicon instead of polycrystalline silicon of Poly-Buffered LOCOS structure (PBL).

DESCRIPTION OF THE RELATED ART

Generally, it is necessary to decrease the dimension of each element and also to decrease the width and size of isolation regions present between elements in order to improve high-integration of semiconductor devices with more-increasing complexity thereof.

Cell size is greatly affected by the above decreases, and as a result, the element isolation technique is very significant in determining memory cell size.

There are several conventional methods for forming an isolation film of internal elements including: the LOCal Oxidation of Silicon (LOCOS) which is a method of isolating insulating substance, PBL which is a method of employing oxide film, polycrystalline silicon layer, and nitride layer on a semiconductor substrate, and the Trench method of forming a groove on a semiconductor substrate and filling it with insulating substance. However, there are disadvantages to each of the above methods.

The LOCOS method involves problems such as the reduction of the effective regions by the bird's beak due to the side spread of oxygen during the oxidation process of element isolation insulating film, the phenomenon that field oxide film is ungrown in the small area, and the field oxide thinning of isolation insulating film of internal elements, etc.

In the conventional PBL method, the length of the bird's beak can be made shorter than in the LOCOS method by using polycrystalline silicon; however, the problem of the bird's beak occurs again when it is employed in the design rule of the dimension less than 0.35 μm. Therefore, reduction of the bird's beak is required in order to apply the conventional PBL method on a device with a dimension less than 0.35 μm.

Recently, the Trench method, or modified LOCOS method, has been employed in order to address the above problems of the LOCOS and the PBL methods. However, the Trench method results in reduction of the productivity of devices because the processing steps thereof are so complicated.

In respect thereof, FIGS. 1 to 4 show the cross-section of the method of forming isolation insulating film of a semiconductor device by PBL structure according to the conventional art.

First, as shown in FIG. 1, a pad oxide film 2, a polycrystalline silicon film 3, and a nitride film 4 are formed over a semiconductor substrate 1 in sequence.

Here, the polycrystalline silicon film 3 functions to buffer the stress of the nitride film 4.

Then, as shown in FIG. 2, a field region 5 is formed by etching the nitride film 4 using an element isolation mask (not shown). Here, the polysilicon film 3 is etched by a certain thickness due to the excessive etching in the above nitride film 4 etching process.

Subsequently, as shown in FIG. 3, a field oxide film 6 is formed by field-oxidizing the exposed surface of the semiconductor substrate 1.

Here, the nitride film 4 functions to reduce the length of the bird's beak by suppressing the growth of the field oxide film 6. Then, as shown in FIG. 4, the nitride film 4, the polycrystalline silicon film 3, and the pad oxide film 2 are removed, and an isolation film 7 of elements is formed over the semiconductor substrate 1. Here, the field oxide film 7 forms a smaller bird's beak than in the LOCOS method.

In addition, FIG. 5 is a top view of FIG. 4, which illustrates an element isolation insulating film 7 and an effective active region 8 formed by 0.3 μm of the design rule.

"A" of FIG. 4 illustrates the interface of the element isolation region and the effective active region in the layout. "a" illustrates the interface of the element isolation region and the effective active region after element isolation process. "Aa" illustrates the length of the bird's beak generated after element isolation process.

In "a", the interface of the element isolation region and the effective active region which forms, is rough.

FIG. 6 is a cross-sectional view of the structure of the polycrystalline silicon film 3 in order to illustrate the rough interface of the above "a" as shown in FIG. 5.

The above polycrystalline silicon film 3 is formed by a desired thickness by using SiH4 or Si2H6 gas, as the process of FIG. 1.

Here, the above polycrystalline silicon film 3 is formed as grain 3a and grain boundary 3b.

In addition, in the oxidation process thereof, the oxide film (t2OX-GB) is formed around the grain boundary 3b with greater thickness than around grain 3a because the oxidation rate at the grain boundary 3b is higher than that at the grain 3a.

As a result, the interface of element isolation film 7 is rough as shown in FIG. 5.

In the conventional element isolation process, field oxide process is carried out by wet oxidation method in order to shorten the processing time so as to increase the rate of field oxidation. Because of this, the crystal grain boundary of the polycrystalline silicon film is oxidized faster than the above crystal grain so that the roughness of the interface increases.

The gate oxide film formed in the following process is degraded if the interface of the element isolation region and the effective active region is rough as described above. In addition, the oxidation in the grain boundary results in the generation of a large bird's beak.

As described above, there are some problems in the formation of an element isolation film of a semiconductor device according to the conventional technology. In the conventional method according to the prior art, as the design rule decreases, the roughness of the interface increases.

In addition, the degradation of the characteristics of the gate oxide film formed in the following process and the large bird's beak result in the reduction in quality and reliability of the semiconductor device. Further, it is difficult to expect the highly-integrated semiconductor devices.

SUMMARY OF THE INVENTION

The present invention is directed to providing a method of forming element isolating film of a semiconductor device, which substantially obviates one or more of the problems caused by limitations and disadvantages of the related art.

One object of the present invention is to provide a method of forming isolation insulating film of internal elements of a semiconductor device by employing PBL method so that the quality and reliability of semiconductor devices are improved along with the high-integration thereof.

In accordance with an aspect of the present invention, these objects are accomplished by providing a method of forming an element isolation insulating film comprises the steps of: forming a pad-oxide film, a stack-silicon film, and a nitride film on a semiconductor substrate in sequence; forming an element isolation region by selectively patterning the nitride film with an etching process by using element isolation mask; and forming an element isolation film by field-oxidizing the element isolation region over the semiconductor substrate.

In accordance with an aspect of the present invention, a method of forming an element isolation insulating film comprises the steps of: forming a pad-oxide film, a stack-amorphous silicon film, and a nitride film on a semiconductor substrate in sequence; forming an element isolation region by selectively patterning the nitride film with etching process using element isolation mask; and field-oxidizing the element isolation region disposed over the semiconductor substrate by the wet-oxidation process and the dry-oxidation process, to form an element isolation film.

In accordance with an aspect of the present invention, a method of forming an element isolation insulating film comprises the steps of: forming a pad-oxide film, a stack-polycrystalline silicon film, and a nitride film on a semiconductor substrate in sequence; forming an element isolation region by selectively patterning the nitride film with etching process using element isolation mask; and field-oxidizing the element isolation region disposed over the semiconductor substrate by the wet-oxidation process and the dry-oxidation process, to form an element isolation film.

The present invention is intended to greatly reduce the dimensions of grain and grain boundary by periodically shutting off the flow of SiH4 or Si2H6, the source gas, for a certain amount of time during the deposition of polycrystalline silicon film, in order to prevent the roughness in the interface of the element isolation region and the effective active region.

In addition, a stack-silicon film is formed by forming a native oxide film to suppress the growth of grain boundary during the shut-off of the flow of SiH4 or Si2H6. The oxidation amount of grain and grain boundary is then minimized by using both the dry-oxidation method and the wet-oxidation method so as to improve the interface property of the element isolation region and the effective active region.

As a result, the degraded characteristic of gate-oxide film is prevented and the effective region is increased by suppressing the growth of the bird's beak, and therefore, element isolation insulating film of a highly-integrated semiconductor device is formed without using the complicated steps of the modified LOCOS method or the Trench method.

In addition, an amorphous stack-silicon film is formed by depositing the stack-silicon film at a low temperature. A stack-polysilicon film having grain and grain boundary is formed by phase-transition during the following process of field-oxide film formation. Then an element isolation insulating film is formed by performing a dry oxidation process so as to minimize the oxidation amount of grain and grain boundary and improve the interface characteristics of the element isolation insulating region and the effective region.

It is to be understood that both the foregoing general description and the following detailed description are exemplary and explanatory and are intended to provide further explanation of the invention as claimed.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Reference will now be made in detail to the preferred embodiments of the present invention, examples of which are illustrated in the accompanying drawings.

FIGS. 7 to 10 are cross-sectional views showing a method for forming element isolation insulating film of a semiconductor device according to one embodiment of the present invention.

Figure 7:
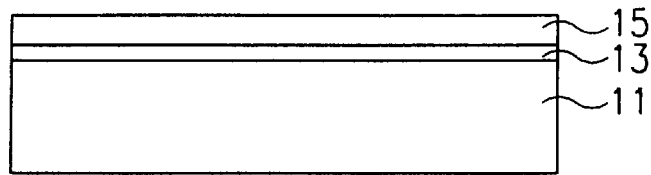
FIGS. 7 to 10 are cross-sectional views showing the method of forming an insulating film for internal elements of a semiconductor device according to the present invention.

First, as shown in FIG. 7, a pad-oxide film 13 is formed over the semiconductor substrate 11, and a stack-polycrystalline silicon film 15 is formed over the pad-oxide film 13 by using CVD method.

Here, the stack-polycrystalline silicon film 15 is formed as multi-layered polycrystalline silicon film having a native oxide film formed on the interface of each layer, and this is illustrated in the following FIG. 11 and FIG. 12.

Figure 8:
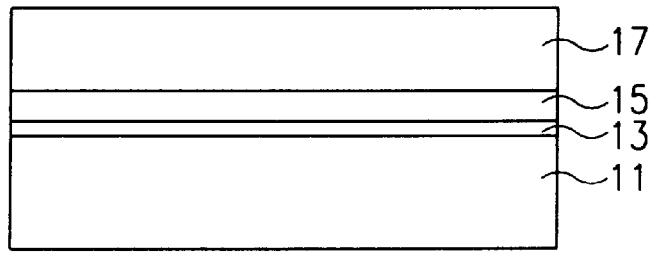
Figure 9:
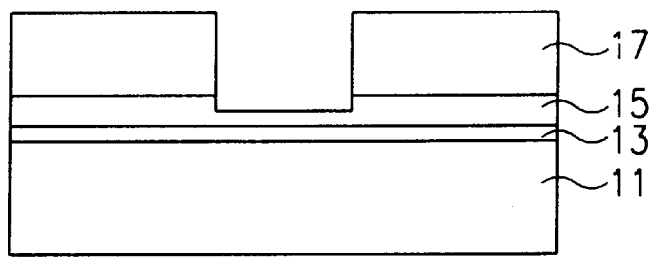

Then, as shown in FIG. 8, a nitride film 17 is formed over the stack-polycrystalline silicon film 15, and PBL structure is formed by the stacked structure of a pad-oxide film 13, a stack-polycrystalline silicon film 15, and a nitride film 17.

Then, the nitride film 17 is etched using an element isolation mask (not shown). Here, the stack-polycrystalline silicon film 15 is etched by a certain thickness by the above excessively-performed etching for the nitride film 17.

Then, field-oxidation process is performed at a temperature of 900–1200° C. by using the nitride film 17 as an oxidation barrier, thereby forming an element isolation film 19.

The field-oxidation process is carried out by employing the wet-oxidation and dry-oxidation processes in turn so as to minimize the difference in the oxidation rate of grain and grain boundary of polycrystalline silicon generated in the wet oxidation process, and improve the interface characteristics of element isolation region and effective active region.

In addition, the degraded characteristic of a gate oxide film in the following process is prevented.

Figure 13:
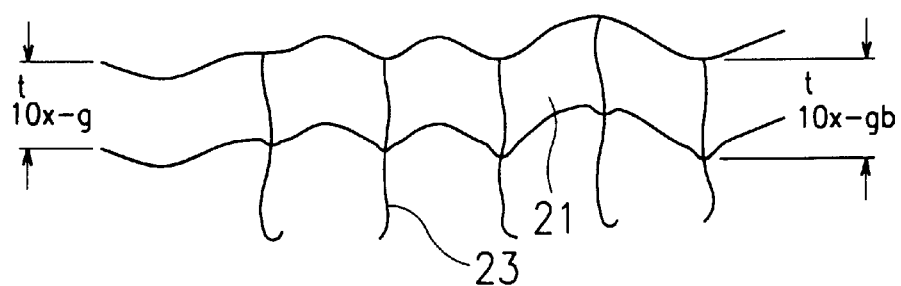
FIG. 13 is a cross-sectional view showing the oxidation of crystal grain and crystal grain system of polycrystalline silicon according to the present invention.
Figure 14:
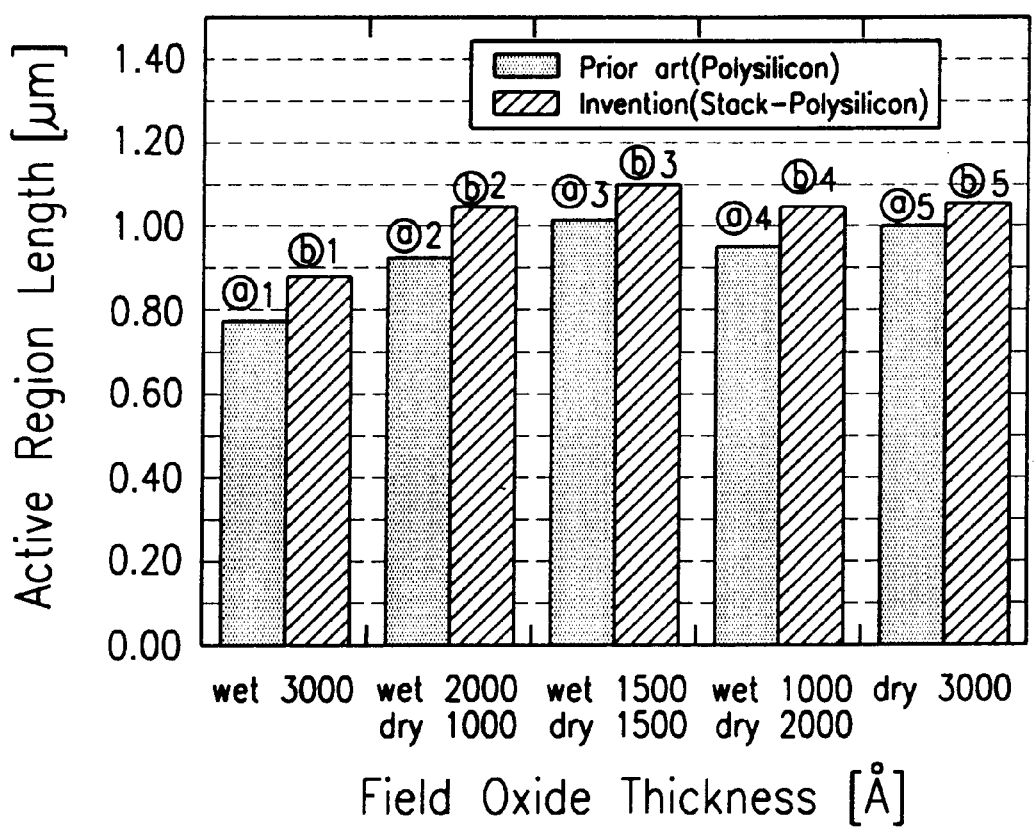
FIG. 14 shows a comparison of the conventional field-oxidation process and the present invention, illustrating the length of the effective active regions formed in the wet method and the dry method, respectively, including specific thickness.
Figure 15:
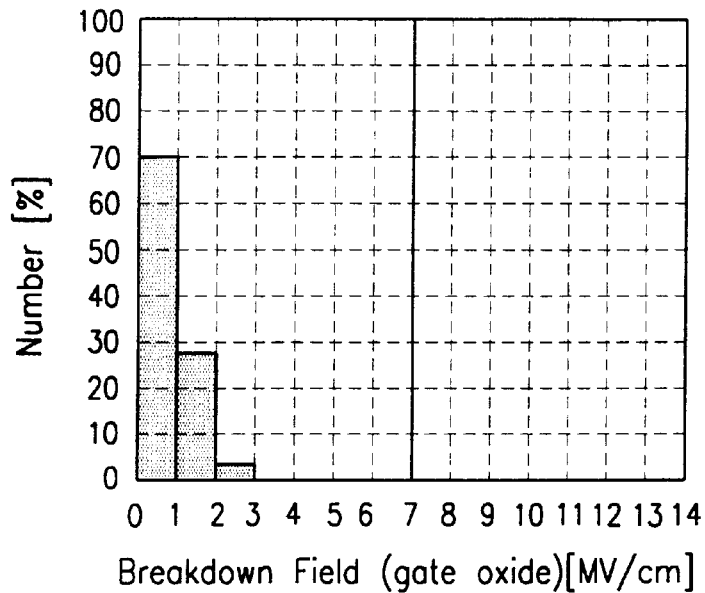
FIGS. 15 and 16 show the distribution of a electric breakdown field of gate oxide film after field-oxidation process in the conventional one and the present invention.

In addition, as shown in FIGS. 13, 14 and 15, the description for the field-oxidation process and the effect thereby is made in detail.

Figure 11:
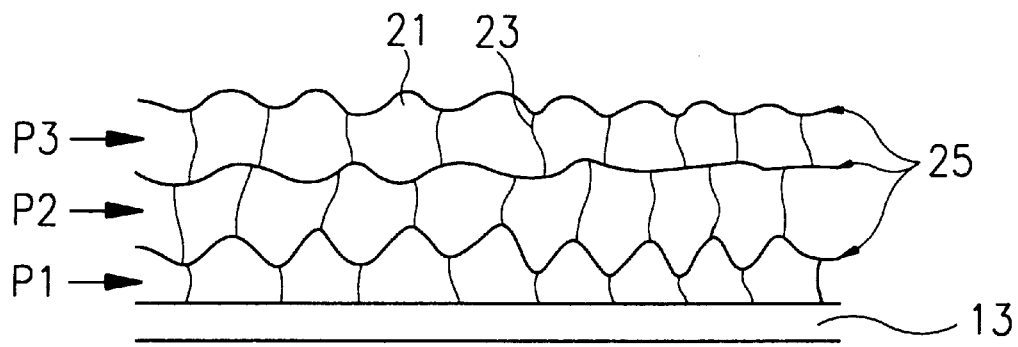
FIG. 11 is a cross-sectional view showing the structure of crystal grain and crystal grain boundary of stack-polycrystalline silicon used in the embodiment of the present invention.
Figure 12:
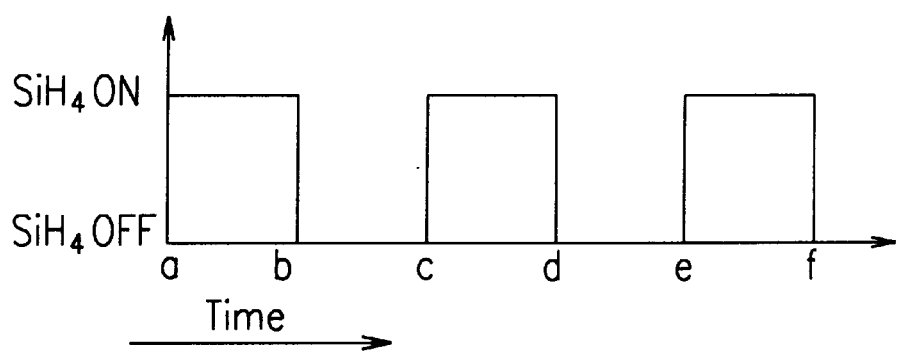
FIG. 12 is a graph showing the on/off signal of SiH4 gas during the formation of the stack-polycrystalline silicon.

FIG. 11 is a cross-sectional view showing the stack-polycrystalline silicon film 15 formed over the pad-oxide film 13, and FIG. 12 shows a stack-polycrystalline silicon film 15.

First, as shown in FIG. 11, the deposition of the stack-polycrystalline silicon film 15 having grain 21 and grain boundary 23 by CVD method is carried out under the following deposition conditions. Deposition pressure is 0.2–0.6 Torr, and the flow of source gas, SiH4 gas or Si2H6 gas, is 700–1200 sccm.

Here, the flow of the SiH4 gas or Si2H6 gas is shut off in the range of b–c, d–e for 1–7 min., and the SiH4 gas or Si2H6 gas is flowed in the range of a–b, c–d, e–f so as to form stack-polycrystalline silicon film 15 by a desired thickness.

Amorphous silicon is formed at a temperature of 450–600° C. for silicon-deposition, and polycrystalline silicon is formed at a deposition temperature of 600–650° C.

In the above deposition process, when the flow of the source gas, SiH4 or Si2H6 gas, is shut off, a native oxide film 25 is formed due to the remaining oxygen inside the processing chamber depositing the stack-polycrystalline silicon film 15. The native-oxide film 25 can be formed by flowing inert gas, such as nitrogen gas or argon gas by 10–30 slm in the range of b–c, and d–e.

Accordingly, the stack-polycrystalline silicon film 15 is formed as the 1,2,3 stack-polycrystalline silicon film, that is, P1/P2/P3 stacked-structure, and a native oxide film 25 is formed over the each upper side of the P1,P2,P3.

Meanwhile, when the deposition temperature of silicon is 500–600° C., stack-amorphous silicon films are deposited. The stack-amorphous silicon film are converted to the stack-polycrystalline silicon film having grain and grain boundary during subsequent thermal field oxidation.

Figure 1:
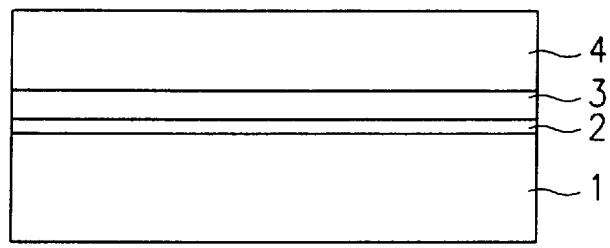
FIGS. 1 to 4 are cross-sectional views showing the conventional method of forming an insulating film for internal elements of a semiconductor device.
Figure 2:
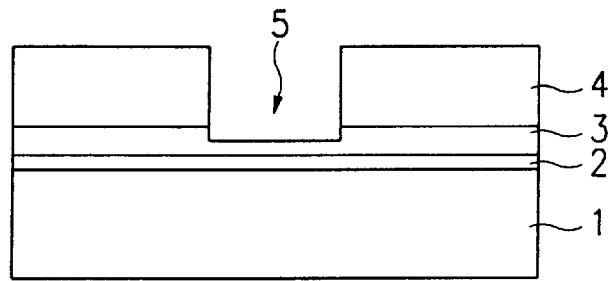
Figure 3:
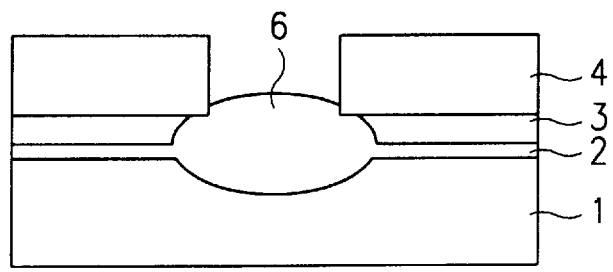
Figure 4:
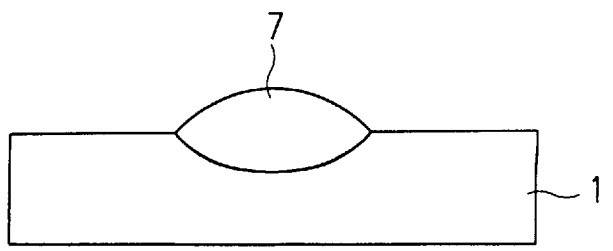
Figure 5:
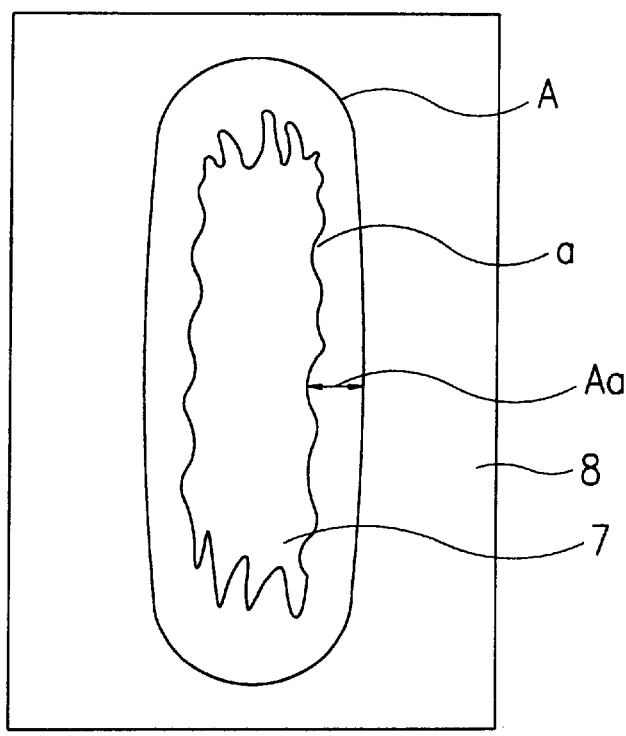
FIG. 5 is a top view of the FIG. 4 according to the prior art.
Figure 6:
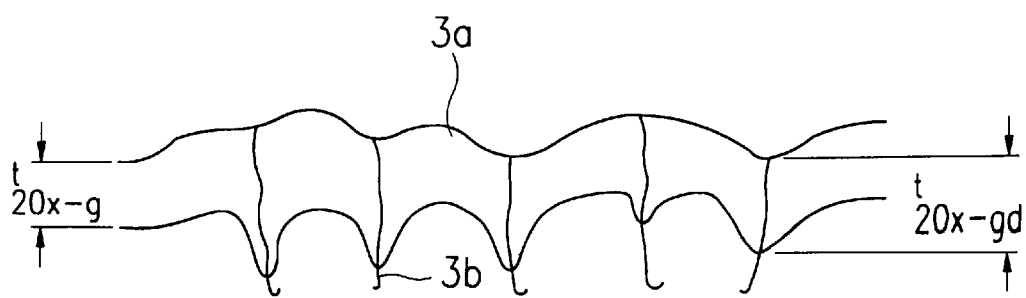
FIG. 6 is a cross-sectional view showing the oxidation of crystal grain and crystal grain boundary of polycrystalline silicon used in the prior art.

Here, the stack-polycrystalline silicon film having n-layer stacked structure is formed by shutting off the SiH4 gas with n-1 times in the interface of n (n: integer of two and above) layer so as to form native oxide film as shown in FIG. 2.

Inert gas such as nitrogen gas or argon gas can be injected during shut-off of the source gas so as to form oxide film or nitride film.

Figure 10:
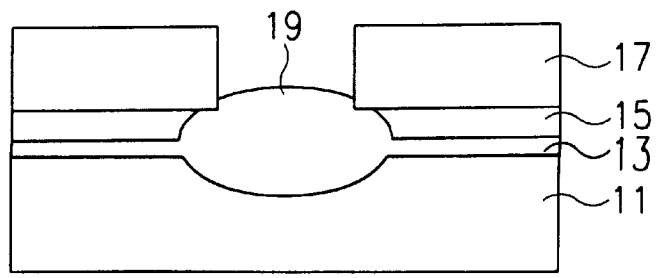

FIGS. 13 to 16 show the field oxidation process and its effect of the FIG. 10.

FIG. 13 is a cross-sectional view showing the oxide film thickness at the grain 21 and the grain boundary 23 of the stack-polycrystalline silicon film 15 during the dry and the wet field-oxidation processing of the FIG. 10.

According to the FIG. 13, the oxidation rates at the grain 21 and the grain boundary 23 are similar so that the oxide film thickness at the grain 21 (t1OX-G) and the oxide film thickness of the grain boundary 23 (t1OX-GB) are similar.

FIG. 14 is a graph showing the effective active region length according to the ratio of wet oxidation process to dry oxidation process after field-oxidation process by the dry and the wet method of FIG. 10 when the process is applied on the cell having 0.25 μm design rule.

According to FIG. 14, the (a) and (b) show the effective active region length in the case of formation of element isolation insulating film by applying the conventional poly-crystalline silicon film and the stack-polycrystalline silicon film of the present invention respectively.

Here, (a1) and (b1) show the effective active length when the field-oxidation process is carried out by wet-oxidation method, and (a2) and (b2) show the effective active length when performing wet-oxidation and dry-oxidation processes with 2:1 thickness ratio of field oxide.

In addition, (a3) and (b3) show the effective active length when performing wet-oxidation and dry-oxidation processes with 1:1 thickness ratio of field oxide, and (a4) and (b4) show the effective active length when performing wet-oxidation and dry-oxidation processes with 1:2 thickness ratio of field oxide.

In addition, (a5) and (b5) show the effective active length when performing field-oxidation process with only the dry-oxidation method.

As shown in the (a1) and (b1), in the field-oxidation process by only wet-oxidation method, the rate of the field-oxidation is high and the bird's beak is large so that the effective active region length is short.

In addition, field oxidation is performed slowly in the field-oxidation process by only dry-oxidation, and in particular, it shows a shorter effective active region length even in the case of applying both of wet-oxidation and dry-oxidation appropriately. Therefore, the case of employing wet-oxidation and dry-oxidation appropriately together as shown in the (a3) and (b3) shows the longest effective active region length.

In the case where stack-polysilicon is used in the present invention, a wider effective active region is shown than when conventional polysilicon is used.

Figure 16:
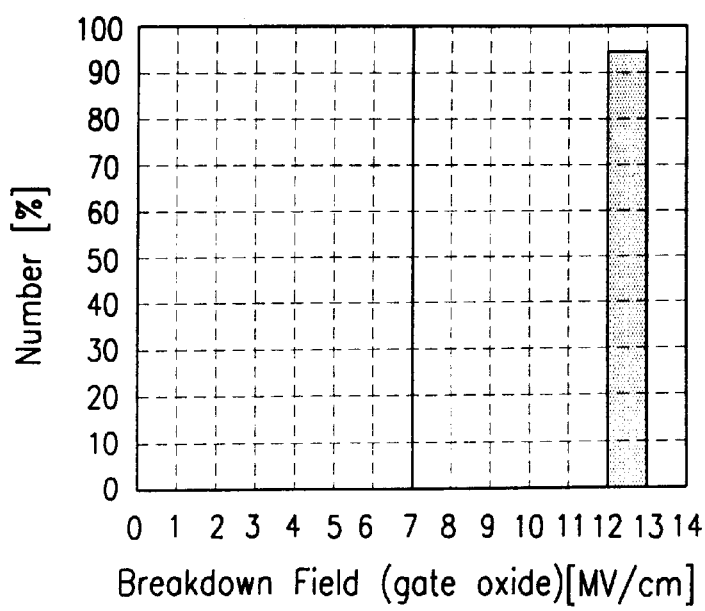

FIGS. 15 and 16 are graphical representations showing the destructive electric breakdown field distribution when the PBL process is applied on 0.25 μm of design rule according to the conventional one and the present invention respectively.

Especially, as shown in FIG. 16, the breakdown voltage of gate oxide film by PBL process of the present invention is substantially high unlike the case with the PBL process of the prior art.

According to the method of forming element isolation insulating film of a semiconductor device of the present invention, stack-silicon film is employed instead of poly-crystalline silicon film of PBL structure, and wet-field oxidation and dry-field oxidation process are employed appropriately together so that the dimension of bird's beak is reduced and therefore, the effective active region length is increased.

Therefore, the characteristics of gate oxide film formed in the following process is improved thereby resulting in the improvement of the quality and reliability of semiconductor devices and providing highly-integrated semiconductor devices.

While the present invention has been described in detail, it should be understood that various changes, substitutions and alterations can be made hereto without departing from the spirit and scope of the invention as defined by the appended claims.

What is claimed is:

1. A method of forming an element isolation insulating film of semiconductor devices comprising the steps of:

forming a pad-oxide film, a stack-silicon film, and a nitride film on a semiconductor substrate in sequence, wherein the stack-silicon film is formed of n-layers, where n is an integer of two and above, and an insulating film dissimilar to the stack-silicon film is formed on each interface of the n-layers comprising the stack-silicon film;

forming an element isolation region by selectively patterning the nitride film with etching process using element isolation mask; and field-oxidizing the element isolation region disposed over the semiconductor substrate, wherein the field-oxidation process is performed by carrying out wet-oxidation process and dry-oxidation process to form an element isolation film.

2. The method of claim 1, wherein the stack-silicon film is formed by CVD method by flowing SiH4 of 700–1200 sccm under the pressure of 0.2–0.6 Torr.

3. The method of claim 1, wherein the dissimilar insulating film is formed as native oxide film generated by stopping the source gas flow with n-1 times for a certain amount of time during the formation of n-layers of the stack-silicon film.

4. The method of claim 1, wherein the dissimilar insulating film is formed as insulating film such as oxide film or nitride film generated by stopping the source gas flow with n-1 times for a certain time and by flowing inert gas during the formation of n-layers of the stack-silicon film.

5. The method of claim 4, wherein the dissimilar insulating film is formed by using 10–30 slm of inert gas.

6. The method of claim 1, wherein the stack-silicon film is formed by employing CVD at a temperature of 450–650° C. as stack-polycrystalline silicon film.

7. The method of claim 1, wherein the stack-silicon film is formed by employing CVD at a temperature of 450–600° C. as stack-amorphous silicon film.

8. The method of claim 1, wherein the stack-silicon film is formed by employing CVD at a temperature of 600–650° C. as stack-polycrystalline silicon film.

9. The method of claim 1, wherein the field-oxidation process is performed such that the wet-oxidation process and the dry-oxidation process are carried out with a 1:1 thickness ratio of field oxide.

10. The method of claim 1, wherein the element isolation insulating film is formed with a thickness of 2500–3500 Å.

11. The method of claim 1, wherein the field-oxidation process is performed at a temperature of 900–1200° C.

12. A method of forming an element isolation insulating film of semiconductor devices comprising the steps of:

forming a pad-oxide film, a stack-amorphous silicon film, and a nitride film on a semiconductor substrate in sequence;

forming an element isolation region by selectively patterning the nitride film with etching process using element isolation mask; and field-oxidizing the element isolation region disposed over the semiconductor substrate by the wet-oxidation process and the dry-oxidation process, to form an element isolation film.

13. The method of claim 12, wherein the stack-amorphous silicon film is formed using the CVD method at a temperature of 450–600° C.

* * * * *